(12) United States Patent
Lai et al.

(10) Patent No.: US 6,716,680 B2
(45) Date of Patent: Apr. 6, 2004

(54) PROCESS FOR MANUFACTURING REFLECTIVE TFT-LCD WITH ROUGH DIFFUSER

(75) Inventors: Han-Chung Lai, Jung Li (TW); Yen-Hua Hsu, Taipei (TW); Shu-Chin Lee, Miao Li (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/040,484

(22) Filed: Jan. 9, 2002

(65) Prior Publication Data

US 2003/0017655 A1 Jan. 23, 2003

(30) Foreign Application Priority Data

Jul. 18, 2001 (TW) ........................................ 90117607 A

(51) Int. Cl.$^7$ ............................................... H01L 21/00
(52) U.S. Cl. ....................................................... 438/149
(58) Field of Search ...................... 438/149, 48, 158, 438/160, 166, 159; 359/900

(56) References Cited

U.S. PATENT DOCUMENTS

| | | | |
|---|---|---|---|
| 5,204,765 A | * | 4/1993 | Mitsui et al. ................ 359/900 |
| 5,418,635 A | * | 5/1995 | Mitsui et al. ................ 359/900 |
| 5,633,738 A | * | 5/1997 | Wakui et al. ................. 349/46 |

* cited by examiner

Primary Examiner—Wael Fahmy
Assistant Examiner—(Vikki) Hoa B. Trinh
(74) Attorney, Agent, or Firm—Troxell Law Office PLLC

(57) ABSTRACT

A method of forming a TFT-LCD device with a rough pixel electrode is disclosed. The method comprises the following steps. First, a photosensitive layer is formed on the transparent insulating substrate. A defocused exposing procedure is then performed by applying a mask with plural independent spot patterns and a contact hole pattern to define patterns on the photosensitive layer. Notedly the distance between two adjacent independent spot patterns is smaller than the resolution of exposure system. Thus the area of photosensitive layer corresponding to independent spot patterns is exposed incompletely. Then the photosensitive layer is developed to remove partial photosensitive layer to form wave-like surfaces thereon. Next a pixel electrode is formed on the photosensitive layer to have rising and falling surfaces with the photosensitive layer to serve as a rough diffuser member.

13 Claims, 4 Drawing Sheets

PROCESS FOR MANUFACTURING REFLECTIVE TFT-LCD WITH ROUGH DIFFUSER

FIELD OF THE INVENTION

The present invention relates to a process for manufacturing TFT liquid crystal displays and, more specifically, to a process for manufacturing pixel electrodes with rough diffuser surfaces for serving as the reflection members of TFT-LCD devices.

BACKGROUND OF THE INVENTION

With the advance of techniques for manufacturing thin-film transistors, the liquid crystal displays (LCD) are widely applied in electrical products, such as PDAs, laptops, cell phones, high resolution television sets, etc. due to advantages as smaller size, portability, and lower power consumption. Particularly the up-to-date reflective LCD device is usually performed by utilizing the reflection of light incident from outside, wherein the pixel electrodes made of metal materials are applied to serve as reflection members. Thus the light reflected form the pixel electrodes performs desired images on the displays through liquid crystal molecules and color filters. The reflective type liquid crystal display which does not require a backlight has been vigorously developed because these type of displays are power saving, thin and lightweight. In addition, since members for the backlight are not necessary, the cost may be reduced.

Notedly, the deeply concerned and important key point is how to promote efficiency of light reflection because the light source of the reflective type LCD comes from the external illumination. In prior art, polarizing plates are introduced to adjust the phases of incident lights for increasing reflection intensity. However, it is not practical to apply the additional polarizing plates into the reflective type LCD. Another solution is to fabricate the pixel electrodes with rough surface for serving as the reflection diffusers for completely utilizing external illuminations, promoting efficiency of reflections and increasing contrasts.

Please refer to FIG. 1, the cross-sectional view of TFT-LCD with rough reflection fabricated by prior art is shown. The related process comprises follow steps. A gate structure 12 is defined on a glass substrate 10 first. Then an insulating layer 14 is deposited on surfaces of the gate structure 12. A semiconductor layer 16 such as amorphous silicon, a doped silicon layer 18 and a metal layer are sequentially formed on the gate structure 12. Next a photolithography procedure is performed to define a drain structure 20 and a source structure 22. After the TFT-LCD 24 is fabricated, an additional step is performed to form plural bumps 26 made of photoresists in the areas for defining pixel electrodes. Next a passivation layer 28 such as polymer material is coating on the bumps 26. And a pixel electrode 30 is formed above those layers. Thus, the reflection efficiency is promoted due to the pixel electrode 30 having a rough and uneven surface.

FIG. 2 illustrates the typical method for fabricating the bumps 26. First, an insulating photoresist layer is deposited on the substrate 10, following defining a plurality of photoresist bumps 25 by proceeding photolithography and etching procedures. Then the reflow step is performed to make topography of the photoresist bumps 25 become much smoother, as hemi-spherical bumps 26 indicated in FIG. 3. Wave-like surfaces are continuously formed by depositing foregoing passivation layer 28 on the substrate 10 to cover the bumps 26 uniformly. After that, another photolithography procedure is then performed to form contact hole in the passivation layer 28 to expose partial surface of drain structure 20. At the last, the pixel electrode 30 is deposited to make electrical connection with source structure 20.

Notedly, it is needed to proceed two depositions of material layer (including photoresist layer and following passivation layer). The photolithography and etching procedures are also required to be carried out twice. Therefore the cycle time of the process is prolonged and the complexity increases markedly which cause production reduced.

SUMMARY OF THE INVENTION

The first objective of the present invention is to provide a method for manufacturing a TFT-LCD device having pixel electrodes with rough surfaces for serving as reflection members.

The second objective of the present invention is to provide a method for forming pixel electrodes with rough surfaces, wherein the wave-like surfaces are defined on the photosensitive insulating passivation layer by performing a defocused exposing procedure.

The third objective of the present invention is to provide a method for forming a contact hole and the wave-like surfaces simultaneously on the photosensitive insulating passivation layer by performing a patterning procedure using defocused light.

A method of forming a TFT-LCD device with a rough pixel electrode for serving as the diffuser member is disclosed hereinafter. The method comprises the following steps. First, a gate structure is defined on a transparent insulating substrate, following an insulating layer is deposited on the gate structure and the transparent insulating substrate. Next, a semiconducting layer is formed on the insulating layer. And an etching stopper is defined on the semiconducting layer. A drain structure and a source structure are then fabricated at the side walls of the etching stopper.

Subsequently, a photosensitive insulating passivation layer is formed on the transparent insulating substrate to cover the drain structure and the source structure. The photosensitive insulating passivation layer is then patterned using defocused light. The mask introduced in above patterning step has plural patterns of the independent spots and a contact hole pattern thereon. The distance between two adjacent independent spot patterns is smaller than the resolution of exposure system, while the distance between the adjacent independent spot pattern and the contact hole pattern is larger than it.

The exposed photosensitive insulating passivation layer is then developed to have the wave-like surfaces and the contact holes thereon. After that, a pixel electrode is formed finally on the photosensitive insulating passivation layer to electrical connect to the drain structure. The pixel electrode rises and falls with the surfaces of the photosensitive insulating passivation layer to have a rough diffuser surface.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed hereinafter for manufacturing the TFT-LCD device with pixel electrodes served as diffuser members. A contact hole and the wave-like surfaces are defined simultaneously on a photosensitive insulating passivation layer by proceeding a patterning step with defocused light. Thus the pixel electrodes formed in the following step will rise and fall depending on the passivation layer to have rough diffuser surfaces thereon. The detailed description is given as following.

Figure 1:
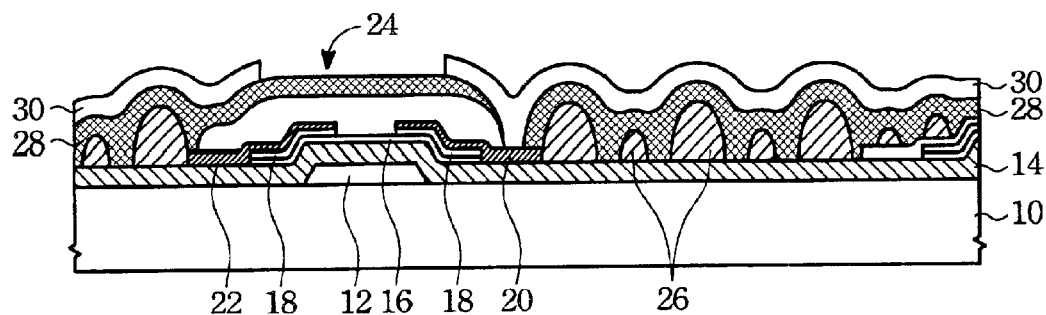
FIG. 1 is a cross sectional view of a transparent insulating substrate illustrating the TFT-LCD device which has the rough reflection members in accordance with the prior art.
Figure 2:
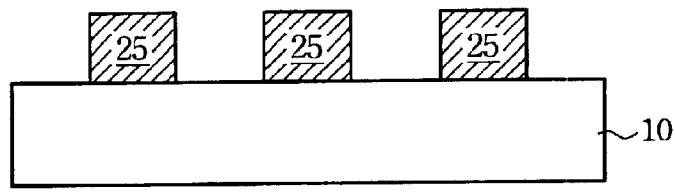
FIG. 2 is a cross sectional view of a transparent insulating substrate illustrating the step of defining the photosensitive insulating photoresist bumps on the substrate by proceeding the photolithography process in accordance with the prior art.
Figure 3:
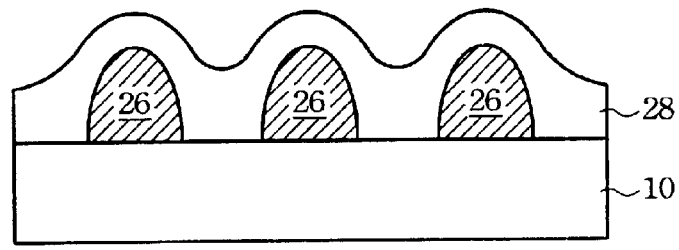
FIG. 3 is a cross sectional view of a transparent insulating substrate illustrating the step of forming an insulating material layer on the photoresist bumps in accordance with the prior art.
Figure 4:
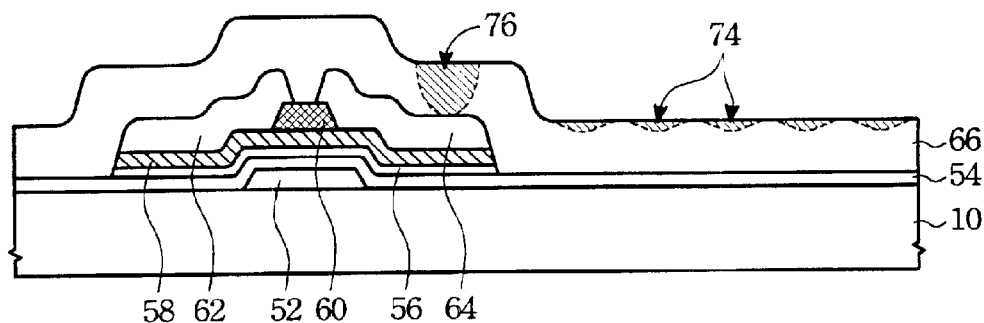
FIG. 4 is a cross sectional view of a transparent insulating substrate illustrating the steps of proceeding defocused exposure on the photosensitive insulating passivation layer in accordance with the present invention.

Please refer to FIG. 4, a gate structure 52 is defined on a transparent insulating substrate 50. In a preferred embodiment, the substrate 50 is made of a glass, quartz, or the likes. The fabrication of the gate structure 52 can be performed by the PVD procedure such as sputtering to form a metal layer first on the transparent insulating layer 50. Then the gate structure 52 is defined by the photolithography and the etching procedures, such as RIE, to have patterns on the metal layer. The material of the gate structure 52 can be selected from a group of aluminum(Al), titanium(Ti), chromium(Cr), tungsten(W), tantalum(Ta), alloy and any combination thereof. As is understood by a person skilled in the art, the storage node and the scan lines (figures not shown) are defined simultaneously in the first photolithography and etching procedures for defining the gate structure 52.

An insulating layer 54 is deposited on the transparent insulating substrate 50 to cover the gate structure 52. In general, the material of the insulating layer 54 can be chosen from a proper insulating material such as oxides, nitrides, or oxynitride. And in the preferred embodiment, the insulating layer 54 is formed of the oxynitride by performing the PECVD procedure. Then a gate insulating layer 56 and a semiconducting layer 58 are defined in sequence on the insulating layer 54. The material of gate insulating layer 56 can choose any insulating materials and preferably such as the silicon nitride. The semiconducting layer 58 for serving as the TFT channel can be made of amorphous silicon.

After that, an etching stopper 60 is defined on the surface of semiconducting layer 58. A source structure 62 and a drain structure 64 are then formed and defined on the side walls of the etching stopper 60 above semiconducting layer 58. In the step of forming the source structure 62 and drain structure 64, a doping silicon layer (n+a-Si) and a metal layer are deposited firstly on the etching stopper 60, semiconducting layer 58, and the insulating layer 54, following an etching step is done to etch those layers for defining the source structure 62 and the drain structure 64 individually. The etching stopper 60 can prevent the TFT channel (semiconducting layer 64) from damage in latter proceeding the photolithography and etching steps.

Still refer to FIG. 4, a photosensitive insulating passivation layer 66 is formed on the transparent insulating substrate 50 to cover the source structure 62, the drain structure 64, and the insulating layer 54. Next a mask with plural independent spot patterns and a contact hole pattern is introduced to proceed defocused exposing procedure on the photosensitive insulating passivation layer 66. It is noted that the distance $d_2$ between each two adjacent spot patterns 68 is smaller than the resolution of the applied exposure system (about 2~3 micron). And the distance d, between adjacent the contact hole pattern 70 and the independent spot pattern 68 is larger than the distance $d_2$. When the defocused exposing step is done, a first area 74 patterned on the photosensitive insulating passivation layer 66 corresponding to the plural independent spot patterns is exposed incompletely. Relatively a second area 76 patterned on the photosensitive insulating passivation layer 66 corresponding to the contact hole pattern 70 is exposed completely.

Figure 6:
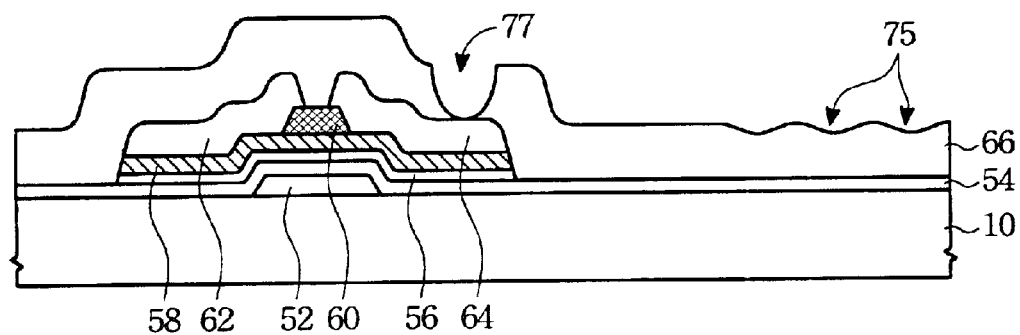
FIG. 6 is a cross sectional view of a transparent insulating substrate illustrating the steps of forming a contact hole and the wave-like surfaces at the photosensitive insulating passivation layer in accordance with the present invention.
Figure 7:
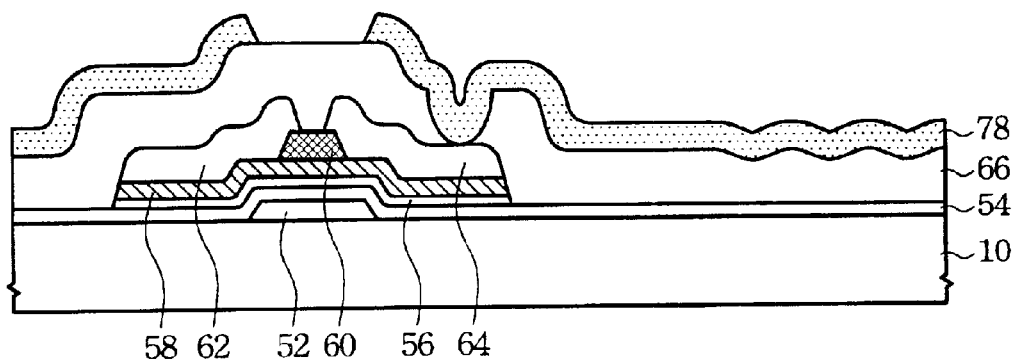
FIG. 7 is a cross sectional view of a transparent insulating substrate illustrating the steps of forming pixel electrodes with rough diffuser members in accordance with the present invention.

Refer to FIG. 6, a developing procedure is performed by applying developing solutions to remove partials photosensitive insulating passivation layer 66 of the first area 74 and the second area 76. Because of the incomplete exposure, the first area 74 corresponding to the plural independent spot patterns 68 have wave-like surfaces 75. And the second area 76 corresponding to the contact hole pattern 70 have the contact hole 77 therein. As described above, though the exposing step is defocused, the contact hole 77 can still penetrate through the photosensitive insulating passivation layer 66 to expose the drain structure 64, even the sidewalls thereof are inclined gently as shown in FIG. 6.

Next, a pixel electrode 78 is formed on the photosensitive insulating passivation layer 66 and filled into the contact hole 77 to connect with the source structure 64. Because the pixel electrode 78 is introduced to serve as the reflecting layer in the reflective TFT-LCD devices, the material of the pixel electrode 78 can be selected from the one which has better reflective characteristics, such as metal materials. In a preferred embodiment, the pixel electrode 78 can be composed of the aluminum. The pixel electrode 78 rises and falls with the underneath photosensitive insulating passivation layer 68 to have the rough diffuser surface.

Figure 5:
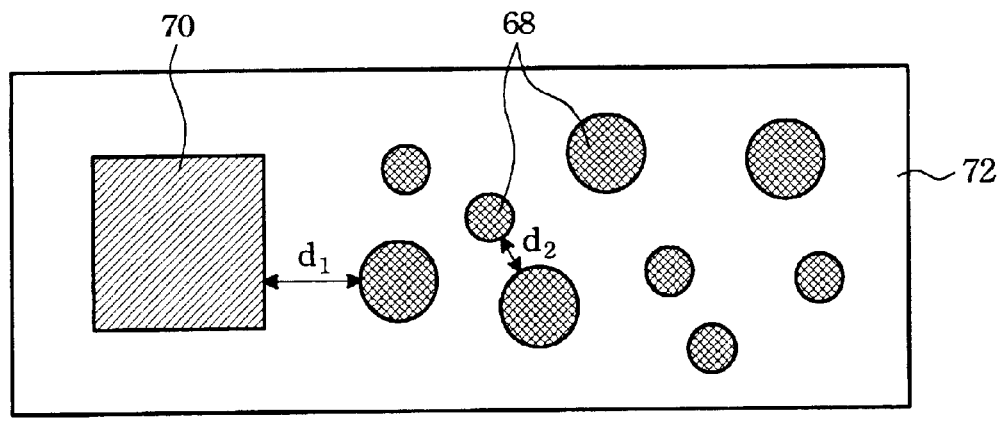
FIG. 5 is a top view of a mask illustrating a pattern of a mask for performing defocused exposure in accordance with the present invention.
Figure 8:
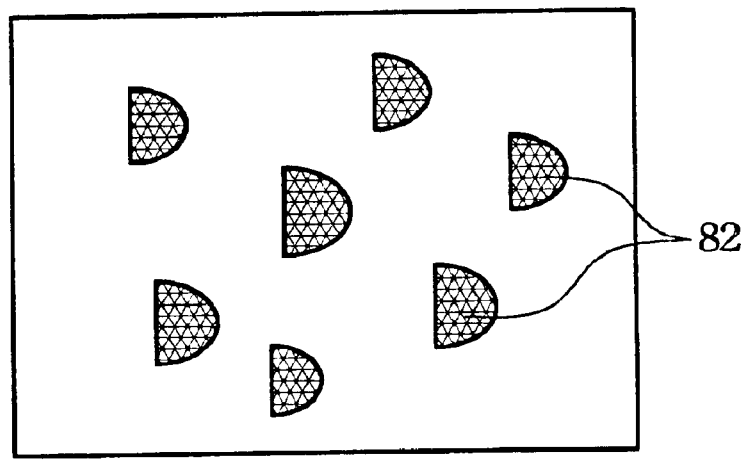
FIGS. 8 and 9 are top views of masks illustrating patterns of the masks for performing the defocused exposing procedures in accordance with the present invention.
Figure 9:
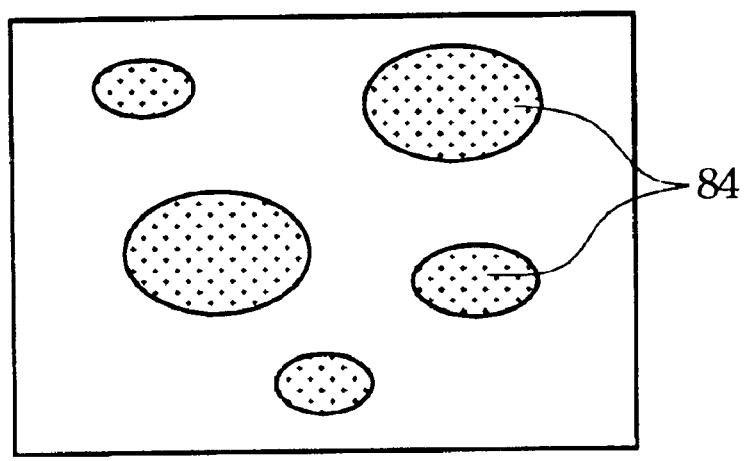

It is noted that, in FIG. 5, the contact hole pattern 70 is a square pattern with larger size, while the independent spot patterns 68 are plural smaller circle patterns. But in the practical manufacture, many kinds of patterns can be chosen to constitute the contact hole pattern 70 and the independent spot pattern 68 arbitrarily depending on the required product. For example, in FIG. 8, semicircle patterns 82 are introduced to be the independent spot patterns 68. And in FIG. 9, ellipse patterns 84 are introduced to be the spot patterns. Certainly by applying various spot patterns with different shapes and dimensions, the roughness of the photosensitive insulating passivation layer 66 can be adjusted. And following the roughness of the pixel electrode can be adjusted. Besides, according to the process required, the hollow areas or the covering areas with chromium films defined on mask can be selected to serve as the spot patterns 68.

Figure 10:
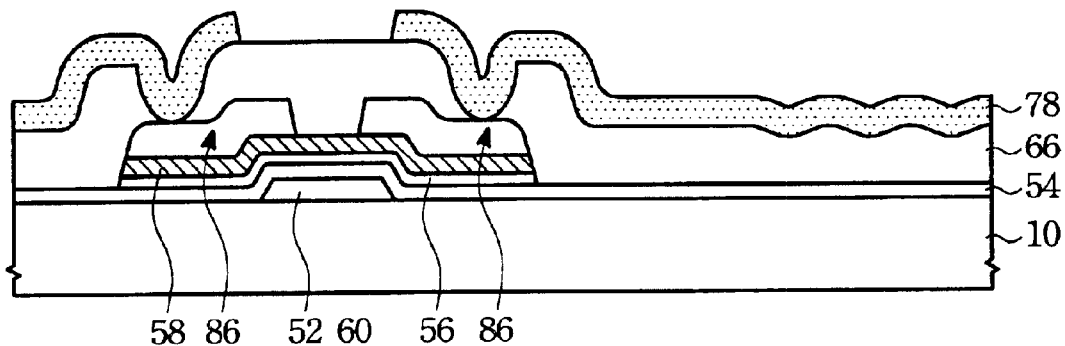
FIG. 10 is a cross sectional view of a transparent insulating substrate illustrating the steps of fabricating pixel electrodes with rough reflection members by BCE and defocused exposing procedures in accordance with the embodiment of the present invention.

The method mentioned above is applied to the process for forming the thin-film transistors with the etching stopper. However the feature of the present invention can also be introduced to the BCE type TFT-LCD devices without the etching stopper. As shown in FIG. 10, after defining the semiconducting layer 58, there is no requirement to form the etching stopper. And a back channel etching step is applied to define the source/drain structures 86. Next the photosensitive insulating passivation layer 66 is deposited and patterned with defocused light to define contact hole and wave-like surfaces on the photosensitive insulating passivation layer 66. Then the pixel electrode 78 is formed thereon to serve as rough diffuser and connected with the source/drain structures 86 through the contact hole.

Figure 11:
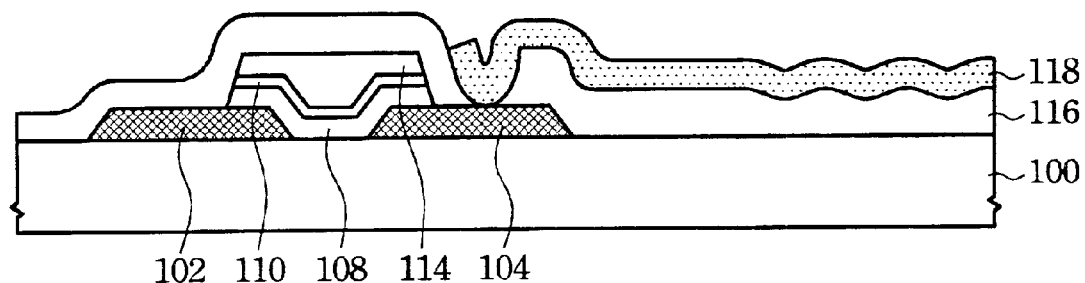
FIG. 11 is a cross sectional view of a transparent insulating substrate illustrating the steps of forming a top gate type TFT-LCD devices with rough reflection members in accordance with the present invention.

The present invention can also be introduced to the top gate type processes. Refer to FIG. 11, a source structure 102 and a drain structure 104 are defined on a transparent insulator substrate 100. Then an amorphous silicon layer 108, a gate insulating layer 110 and a gate structure 114 are formed sequently on the source structure 102, the drain structure 104 and the transparent insulator substrate 100. The amorphous silicon layer 108 is applied to define channels of the thin film transistors.

Subsequently a photosensitive insulating passivation layer 116 is formed to cover the transparent insulator substrate 100. Similarly a defocus exposing procedure is done to have wave-like surfaces and a contact hole on the photosensitive insulating passivation layer 116. Then a pixel electrode 118 is formed on the photosensitive insulating passivation layer 116 and filled into the contact hole to connect electrically the drain structure 104. And the deposited pixel electrode 118 has rough diffusing surface according to the photosensitive insulating passivation layer 116.

The present invention can provide various benefits. For example, the wave-like surfaces of the photosensitive insulating passivation layer are manufactured by proceeding the photosensitive insulating passivation layer fabrication and exposing development once. That means the needed contact hole and the wave-like surfaces are defined simultaneously by performing the defocused exposing procedure just once with single mask. Namely there is no need to form the contact hole and wave-like surfaces using two different mask and exposing twice as the prior art. Thus the cycle time will be shortened and the throughput can be increased.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. For example, the etching stoppers are applied in the embodiment of the description above to prevent the below semiconductor layer from etching damage. However the same structure and feature can also be applied to the back channel etching (BCE) type process to save one photomask for promoting the throughput in advance. And the feature can also be applied to the process for top gate type transistor as described above.

While the preferred embodiment of the invention has been illustrated and described, it will be appreciated that various changes can be made therein without departing from the spirit and scope of the invention.

What is claimed:

1. A method of forming a TFT-LCD device on a transparent insulating substrate wherein a transistor is defined on the transparent insulating substrate, the method comprises the following steps of:

forming a photosensitive layer on said transparent insulating substrate to cover said transistor and said transparent insulating substrate;

performing a defocused exposing procedure by applying a mask with a plurality of independent spot patterns and a contact hole pattern to define patterns on said photosensitive layer, wherein a distance between two adjacent said independent spot patterns is smaller than a resolution of an exposure system while a distance between adjacent said independent spot pattern and said contact hole pattern is larger than said resolution of said exposure system, wherein a first area of said photosensitive layer corresponding to said independent spot patterns is exposed incompletely while a second area thereof corresponding to said contact hole pattern is exposed completely;

developing said photosensitive layer to partially remove said photosensitive layer of said first area to form wave shaped surfaces thereon and to partially remove said photosensitive layer of said second area to form a contact hole thereon; and forming a pixel electrode on said photosensitive layer to fill said contact hole to electrically connect to said transistor, wherein said pixel electrode rises and falls with the surface of said photosensitive layer to server as a rough diffuser member.

2. The method of claim 1, wherein a size of said contact hole pattern is larger than a size of said independent spot pattern.

3. The method of claim 1, wherein sizes and shapes of said independent spot patterns are adjusted to control roughness degrees of pixel electrode.

4. The method of claim 1, wherein sizes and shapes of said independent spot patterns are adjusted to control roughness degrees of said photosensitive layer.

5. The method of claim 1, wherein said independent spot patterns are defined by forming hollow areas on said mask.

6. The method of claim 1, wherein said independent spot patterns are defined by forming the covering area on said mask with chromium films.

7. A method of forming a TFT-LCD device on a transparent insulating substrate wherein said transparent insulating substrate has a gate structure and an insulating layer covered thereon, and a drain structure and a source structure formed on said insulating layer, the method comprises the following steps of:

forming a photosensitive passivation layer on said transparent insulating substrate to cover said source structure, said drain structure and said insulating layer;

performing a patterning procedure by applying a mask with a plurality of independent spot patterns and a contact hole pattern to define patterns on said photosensitive passivation layer, wherein a first area of said photosensitive passivation layer corresponding to said independent spot patterns is exposed incompletely while a second area thereof corresponding to said contact hole pattern is exposed completely;

developing said photosensitive passivation layer to partially remove said photosensitive layer of said first area to form wave shaped surfaces thereon and to partially remove said photosensitive material of said second are to form a contact hole thereon; and forming a pixel electrode on said photosensitive passivation layer to fill said contact hole to electrically connect with said drain structure, wherein said pixel electrode rises and falls with the surface of said photosensitive passivation layer to serve as a rough diffuser member.

8. The method of claim 7, wherein a size of said contact hole pattern is larger than a size of said independent spot pattern.

9. The method of claim 7, wherein sizes and shapes of said independent spot patterns are adjusted to control roughness degrees of said pixel electrode.

10. The method of claim 7, wherein sizes and shapes of said independent spot patterns are adjusted to control roughness degrees of said photosensitive passivation layer.

11. The method of claim 7, wherein said independent spot patterns are defined by forming hollow areas on said mask.

12. The method of claim 7, wherein said independent spot patterns are defined by forming the covering area on said mask with chromium films.

13. The method of claim 7, wherein a first distance between two adjacent said independent spot patterns is smaller than a resolution of an exposure system while a second distance between adjacent said independent spot pattern and said contact hole pattern is larger than said resolution of said exposure system.

* * * * *